United States Patent
Shaw et al.

(10) Patent No.: US 9,570,873 B2
(45) Date of Patent: Feb. 14, 2017

(54) SHORT PULSED IR FIBER LASER AT WAVELENGTH > 2 µM

(71) Applicants: Leslie Brandon Shaw, Woodbridge, VA (US); Rafael R. Gattass, Washington, DC (US); Jasbinder S. Sanghera, Ashburn, VA (US); Ishwar D. Aggarwal, Charlotte, NC (US)

(72) Inventors: Leslie Brandon Shaw, Woodbridge, VA (US); Rafael R. Gattass, Washington, DC (US); Jasbinder S. Sanghera, Ashburn, VA (US); Ishwar D. Aggarwal, Charlotte, NC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/742,566

(22) Filed: Jan. 16, 2013

(65) Prior Publication Data
US 2013/0188660 A1   Jul. 25, 2013

Related U.S. Application Data

(60) Provisional application No. 61/588,203, filed on Jan. 19, 2012.

(51) Int. Cl.
*H01S 3/10* (2006.01)
*H01S 3/00* (2006.01)
(Continued)

(52) U.S. Cl.
CPC ........... *H01S 3/0057* (2013.01); *H01S 3/0092* (2013.01); *H01S 3/06758* (2013.01); *H01S 3/03* (2013.01);
(Continued)

(58) Field of Classification Search
CPC .. H01S 3/0057; H01S 3/0092; H01S 3/06758; H01S 3/1616; H01S 3/06725; H01S 3/1608
(Continued)

(56) References Cited

U.S. PATENT DOCUMENTS 6,990,270 B2 *  1/2006  Nicholson .................. 385/27
7,519,253 B2     4/2009  Islam
(Continued)

OTHER PUBLICATIONS

Sharp et al., "190-fs passively mode-locked thulium fiber laser with low threshold," Optics Letters, vol. 21, No. 12, 881-883 (1996).
(Continued)

*Primary Examiner* — Tod T Van Roy
*Assistant Examiner* — Vu A Vu
(74) *Attorney, Agent, or Firm* — US Naval Research Laboratory; Rebecca L. Forman

(57) ABSTRACT

A method of generating ultrashort pulses with wavelengths greater than 2 µm comprising a short pulse diode laser or fiber laser operating at a wavelength of 1 µm or greater with a pulse width of 10 ps or greater, one or more amplification stages to increase the peak power of the pulsed source, a nonlinear fiber stage whereby the dispersion of the nonlinear fiber is anomalous at the pulsed source wavelength such that the fiber breaks up the pulse into a series of sub-ps pulse train through modulation instability which may be seeded by spontaneous noise which are then wavelength shifted in one or more stages by soliton self frequency shift in anomalous dispersion fiber or Raman in normal dispersion fiber and amplified in one or more stages to generate a high peak power ultrashort pulse (<1 ps) source at a wavelength of 2.4 µm or greater.

18 Claims, 2 Drawing Sheets

(51) Int. Cl.
  *H01S 5/00* (2006.01)
  *H01S 3/094* (2006.01)
  *H01S 3/03* (2006.01)
  *H01S 3/30* (2006.01)
  *H01S 3/108* (2006.01)
  *H01S 3/067* (2006.01)
  *H01S 3/16* (2006.01)

(52) U.S. Cl.
  CPC .......... *H01S 3/0672* (2013.01); *H01S 3/06725* (2013.01); *H01S 3/094046* (2013.01); *H01S 3/108* (2013.01); *H01S 3/1608* (2013.01); *H01S 3/1616* (2013.01); *H01S 3/30* (2013.01); *H01S 3/302* (2013.01); *H01S 5/0057* (2013.01); *H01S 2301/085* (2013.01)

(58) Field of Classification Search
  USPC .......................................... 372/3, 25, 26, 30
  See application file for complete search history.

(56) References Cited

U.S. PATENT DOCUMENTS

2010/0079853 A1    4/2010  Rakich et al.
2011/0306956 A1*  12/2011  Islam .............................. 606/15
2013/0188240 A1    7/2013  Shaw et al.

OTHER PUBLICATIONS

Nishizawa et al., "Widely wavelength-tunable ultrashort pulse generation using polarization maintaining optical fibers," IEEE Journal on Selected Topics in Quantum Electronics, vol. 7, No. 4, 518-524 (2001).

Imeshev et al., "230-kW peak power femtosecond pulses from a high power tunable source based on amplification in Tm-doped fiber," Optics Express, vol. 13, No. 19, 7424-7431 (2005).

* cited by examiner

SHORT PULSED IR FIBER LASER AT WAVELENGTH > 2 μM

PRIORITY CLAIM

This Application claims priority from U.S. Provisional Application No. 61/588,203 filed on Jan. 19, 2012 by Leslie Brandon Shaw et al., entitled "SHORT PULSED IR FIBER LASER AT WAVELENGTH >2 μm," the entire contents of which are incorporated herein by reference.

CROSS REFERENCE

Cross reference is made to copending application Ser. No. 13/742,563, filed Jan. 16, 2013, entitled "IR FIBER BROADBAND MID-IR LIGHT SOURCE," by Leslie Brandon Shaw et al., the entire contents of which are incorporated herein by reference.

BACKGROUND OF THE INVENTION

Field of the Invention

The present invention relates generally to broadband light sources and, more specifically, to high peak power ultrashort IR lasers.

Description of the Prior Art

Optical fiber based short pulsed IR sources are typically based on either mode locked fiber lasers or amplification of short pulsed diode lasers. Typically, mode locked fiber lasers can produce pulses with pulse widths of ~100 fs to 10's of ps while pulsed diode lasers can produce pulses of pulse widths of 10's of ps and higher. Currently, such sources are limited to <2 μm due to the availability of mode locked fiber lasers and diode lasers. For example, thulium mode locked fiber lasers have been demonstrated at wavelengths up to ~2 μm (Sharp et al., "190-fs passively mode-locked thulium fiber laser with low threshold," Optics Letters, 12, 881-83 (1996), the entire contents of which are incorporated herein by reference).

For generation of high peak power ultrashort pulses in fiber at wavelengths greater than 2 μm, fiber based frequency conversion schemes are typically used. Examples of such schemes include Raman scattering in normal dispersion fiber or soliton self frequency shift (SSFS) in anomalous dispersion fiber. Stimulated Raman scattering is the process whereby the optical beam interacts with the vibrational modes of the medium and is downshifted in frequency. Cascaded Raman processes result when the downshifted frequency optical beam is itself shifted one or more times by the Raman process. Soliton self frequency shift is a form of intrapulse Raman whereby the blue frequency components of the pulse pump the red frequency components resulting in a wavelength shifted pulse. Again, SSFS may occur a number of times, depending on input pulse intensity, nonlinearity of medium, interaction length, etc. In all cases, dispersion compensation is typically included to maintain the pulse width.

U.S. Pat. No. 7,519,253 to Islam teaches a pump source consisting of a short pulse laser diode with wavelength of shorter than 2.5 μm and pulse width of at least 100 picoseconds (ps) with one or more optical amplifiers chains and a nonlinear fiber with anomalous dispersion at the diode wavelength that modulates the diode through modulation instability to form ultrashort pulses. Some limitations with Islam's source are that it requires an initial seed pulse duration of greater than 100 ps and it needs an anomalous dispersion fiber. Nishizawa demonstrated SSFS of a short pulsed ~110 femtosecond (fs) 1.5 μm source out to ~2.033 μm in nonlinear fiber (Nishizawa et al., "Widely wavelength-tunable ultrashort pulse generation using polarization maintaining optical fiber," IEEE Journal on Selected Topics in Quantum Electronics, 7, 518-24 (2001)). Some limitations with Nishizawa's source is that it is lower power, has an initial seed pulse of less than 1 ps, and has a maximum wavelength of 2 μm. Imeshev took Nishizawa's work further and demonstrated that these pulses could be amplified in a thulium fiber amplifier, demonstrating amplification of a ~400 fs 1.5 μm pulse train wavelength shifted in a nonlinear fiber and amplified to 1.98 μm in a thulium fiber amplifier (Imeshev et al., "230-kW peak power femtosecond pulses from a high power tunable source based on amplification in Tm-doped fiber," Optics Express, 13, 7424-31 (2005)). Some limitations with Imeshev's source are that it has an initial seed pulse of less than 1 ps and it has a maximum wavelength of 2 μm. U.S. Patent Application 2010/0079853 by Rakich teaches a short pulsed source with low spontaneous noise component and with pulse shape that is optically flat which is Raman shifted to longer wavelengths through a cascaded Raman process in normal dispersion fibers. Some limitations of Rakich are that it needs an initial seed pulse duration of greater than 100 ps, it requires low amplified spontaneous emission in the fiber chain, and it does not give high power.

What is needed but not present in the prior art is a fiber based method of generating high peak power ultrashort (<1 ps) IR pulses at wavelength of >2 μm.

BRIEF SUMMARY OF THE INVENTION

The present invention provides a method of generating ultrashort pulses with wavelengths >2 μm comprising a short pulse diode laser or fiber laser operating at a wavelength of >1 μm with a pulse width of ≥10 ps, one or more amplification stages to increase the peak power of the pulsed source, a nonlinear fiber stage whereby the dispersion of the nonlinear fiber is anomalous at the pulsed source wavelength such that the fiber breaks up the pulse into a series of sub-ps pulse train through modulation instability which may be seeded by spontaneous noise which are then wavelength shifted in one or more stages by SSFS in anomalous dispersion fiber or Raman in normal dispersion fiber and amplified in one or more stages to generate a high peak power ultrashort pulse (<1 ps) source at wavelength of >2.4 μm.

The method of the present invention enables ultrashort pulsed laser beyond 2 μm in a compact all fiber package. The all-fiber design provides a robust, reduced footprint and weight alternative to bulk-optics laser systems. Such sources are useful for spectroscopy and as pumps for nonlinear fiber sources based on non-silica based fibers.

These and other features and advantages of the invention, as well as the invention itself, will become better understood by reference to the following detailed description, appended claims, and accompanying drawings.

DETAILED DESCRIPTION OF THE INVENTION

The present invention describes a fiber based method of generating high peak power ultrashort (<10 ps) infrared laser pulses at a wavelength greater than 2 µm. This invention was developed to address the need for a high-power laser pump for broadband supercontinuum generation in the MWIR for sensor testing.

One embodiment of the present invention provides a method for generating ultrashort high peak power pulses at wavelength of greater than 2.4 µm comprising a pulsed seed source of wavelength >1 µm and pulse width >10 ps, one or more amplification stages, a modulation instability stage in nonlinear fiber whereby the pulse train is broken up into <1 ps pulse train followed by one or more wavelength conversion stages and one or more amplification stages whereby the pulse train is wavelength shifted and amplified to a wavelength of 2.4 µm or greater. Here, the wavelength conversion can be through SSFS in anomalous dispersion fiber or Raman in normal dispersion fiber. The pulse seed source can be a diode laser or fiber laser, the amplification stages can be fiber amplifiers, semiconductor optical amplifiers, or bulk nonlinear crystal optical parametric amplifiers.

In another embodiment, the pulsed seed source can have a pulse width of <1 ps. In this case, the modulation instability stage is not necessary to break the pulse up into a sub-ps pulse train.

In a further embodiment, the amplification stage, wavelength conversion stage, and/or modulation instability stage can be combined. As the input signal is amplified, the high nonlinearity of the fiber shifts some of the power to longer wavelength, reducing the power at the input signal wavelength. In an amplifier the maximum gain for the input signal would be limited by the saturation power. However, because in a nonlinear amplifier some of the power is being shifted to another wavelength, if a long enough nonlinear amplifier fiber length is used, significant power is transferred to the shifted wavelength. The resulting amplified and shifted output provides a clean background free from amplifier ASE for further amplification stages.

In addition, the selection of amplifier materials from one stage to the next with overlapping absorption bands can be used to increase the stability of the complete laser design. Because the ASE from the previous amplifier lies within the absorption band of the next amplifier, each stage of amplification acts as an isolator to the next, minimizing the effect of feedback on the amplifier chain. The use of overlapping absorption bands for amplifiers removes the need for direct isolation between chains, the feature is particularly important for wavelengths in the mid IR (2-12 µm) where optical isolators are hard to manufacture or are currently nonexistent.

Figure 1:
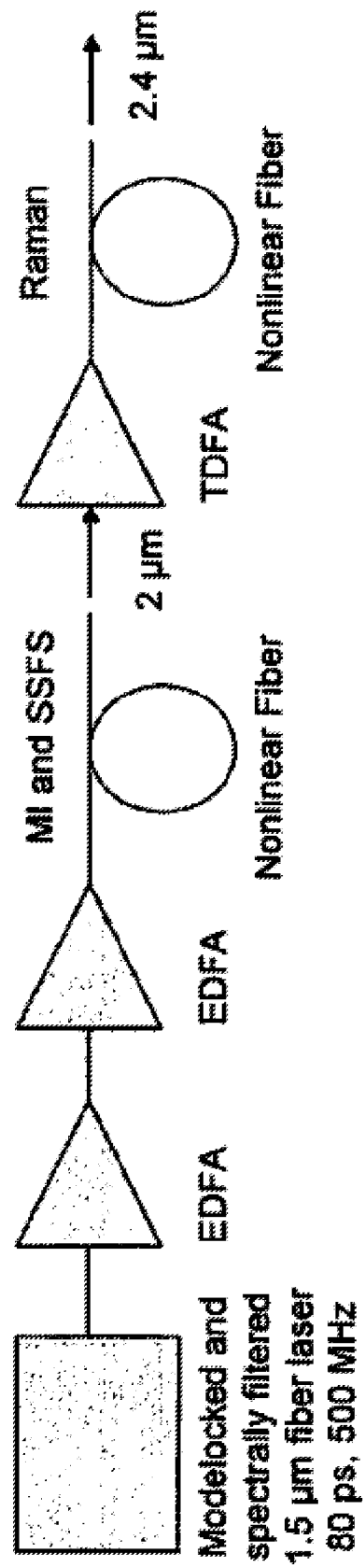
FIG. 1 is a schematic drawing of a short pulse 2.5 μm fiber laser.
Figure 2:
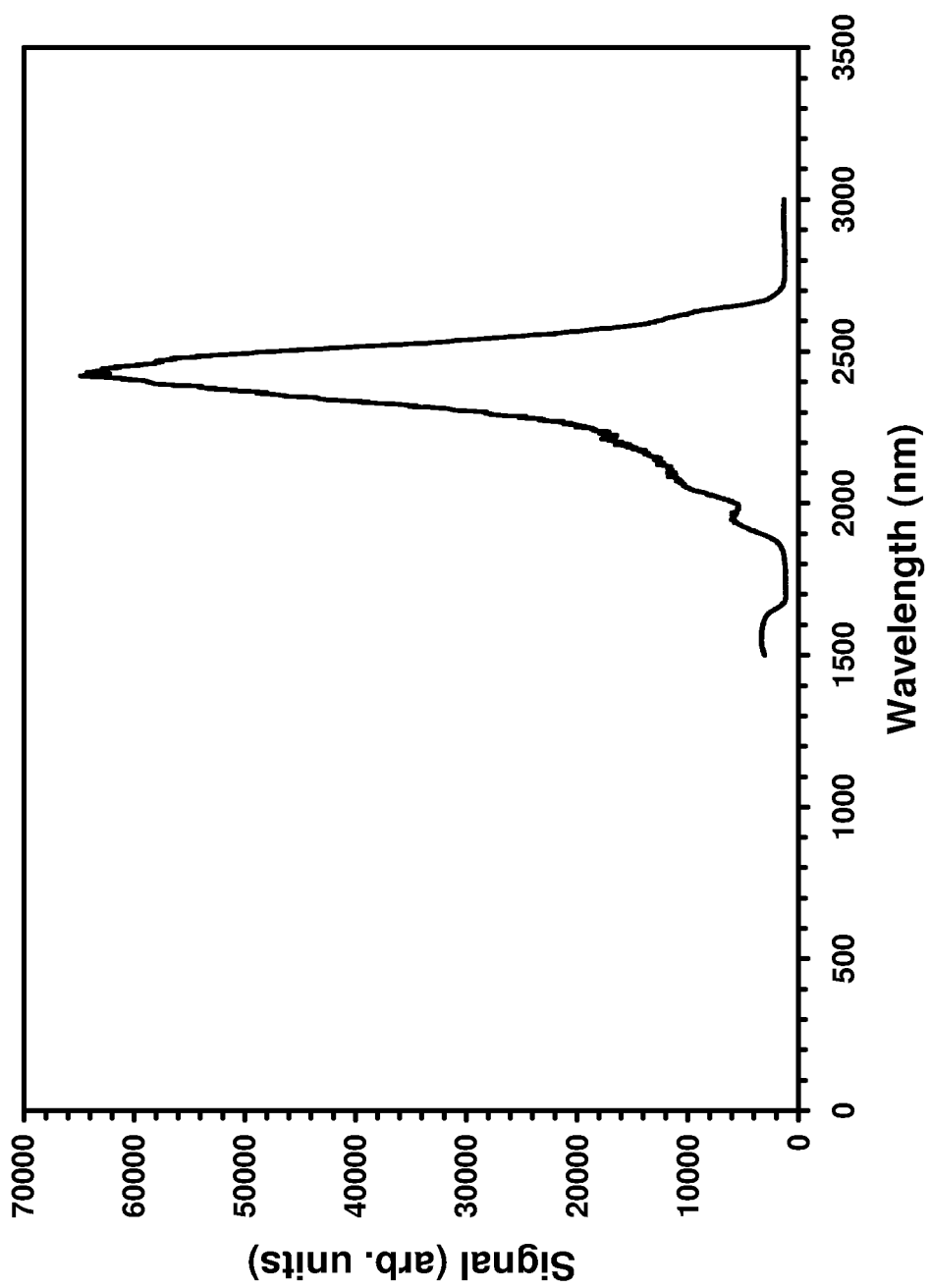
FIG. 2 is a plot showing the output of a short pulse 2.4 μm source.

In one demonstration of the present invention, a short pulse mode locked fiber laser operating at 1.5 µm with pulse width of 80 ps (stretched by spectrally filtering in the gain cavity) with repetition frequency of 500 kHz was amplified by two fiber amplifier modules. The light was injected into a nonlinear fiber whereby modulation instability broke up the 80 ps pulse into a sub-ps soliton pulse train. Here, the modulation instability could be seeded by amplified spontaneous emission (ASE) from the amplifiers. SSFS shifted the pulses to longer wavelengths in the nonlinear fiber. The pulses were injected into a thulium amplifier where the solitons with frequencies within the gain bandwidth of the amplifier were amplified. The light was then injected into a highly nonlinear normal dispersion fiber whereby the light was shifted by cascaded Raman to 2.4 µm. The resulting pump had a pulse width of <1 ps and high peak power of >10 kW. FIG. 1 shows a schematic of the ultrashort pulsed laser source. FIG. 2 shows the spectrum of the pulses at the output.

Example 1

A mode locked thulium fiber laser operating at ~2 µm with pulse width of >10 ps is amplified in a thulium fiber amplifier launched into a nonlinear fiber with anomalous dispersion around 2 µm to break up the pulse through modulation instability to a pulse width of <1 ps and then launched into a highly nonlinear fiber with normal dispersion around 2 µm which shifts the input to 2.4 µm or greater through cascaded Raman amplification.

Example 2

The system of example 1 where the wavelength is shifted to between 2.7 and 2.9 µm and amplified in an Erbium ZBLAN fiber amplifier to produce ultrashort pulses between 2.7 and 2.9 µm.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method for generating ultrashort infrared pulses, comprising:
   using a laser to generate one or more pulses;
   amplifying the pulse in one or more amplification stages, wherein amplifier materials are selected from one stage to the next with overlapping absorption bands thereby removing the need for optical isolators;
   pumping the amplified pulse into one or more nonlinear fibers whereby the fiber breaks up the pulse into a pulse train that is 1 ps or less;
   wavelength shifting the pulse train one or more times; and
   amplifying the wavelength shifted pulse train to a wavelength of 2.4 µm or greater.

2. The method of claim 1, wherein the laser generates a pulse with a wavelength of 1 µm or greater.

3. The method of claim 1, wherein the laser generates a pulse with a pulse width of 10 ps or greater.

4. The method of claim 1, wherein the wavelength shifting is done by soliton self frequency shift in anomalous dispersion fiber or Raman in normal dispersion fiber.

5. The method of claim 1, wherein the laser is a diode laser or a fiber laser.

6. The method of claim 1, wherein amplification is achieved with fiber amplifiers, semiconductor optical amplifiers, bulk nonlinear crystal optical parametric amplifiers, or any combination thereof.

7. The method of claim 1, wherein the laser generates a pulse with a pulse width of less than 1 ps and wherein the amplified pulse does not have to be pumped into one or more nonlinear fibers to break up the pulse into a pulse train.

8. The method of claim 1, wherein amplifying the pulse, pumping the amplified pulse, and wavelength shifting the pulse train are combined into a single step.

9. The method of claim 1, wherein the wavelength shifted pulse train has a high peak power of greater than 10 kW.

10. A system for generating ultrashort infrared pulses, comprising:
    a laser to generate one or more pulses;

one or more amplifiers to amplify the pulse, wherein amplifier materials are selected from one stage to the next with overlapping absorption bands thereby removing the need for optical isolators; and one or more nonlinear fibers into which the amplified pulse is pumped whereby the fiber breaks up the pulse into a pulse train that is 1 ps or less, wherein the pulse train is wavelength shifted one or more times, and wherein the wavelength shifted pulse train is amplified to a wavelength of 2.4 µm or greater.

11. The system of claim 10, wherein the laser generates a pulse with a wavelength of 1 µm or greater.

12. The system of claim 10, wherein the laser generates a pulse with a pulse width of 10 ps or greater.

13. The system of claim 10, wherein the wavelength shifting is done by soliton self frequency shift in anomalous dispersion fiber or Raman in normal dispersion fiber.

14. The system of claim 10, wherein the laser is a diode laser or a fiber laser.

15. The system of claim 10, the amplifier is a fiber amplifier, semiconductor optical amplifier, bulk nonlinear crystal optical parametric amplifier, or any combination thereof.

16. The system of claim 10, wherein the laser generates a pulse with a pulse width of less than 1 ps and wherein the amplified pulse does not have to be pumped into one or more nonlinear fibers to break up the pulse into a pulse train.

17. The system of claim 10, wherein amplifying the pulse, pumping the amplified pulse, and wavelength shifting the pulse train are combined.

18. The system of claim 10, wherein the wavelength shifted pulse train has a high peak power of greater than 10 kW.

* * * * *